United States Patent
Hung et al.

(10) Patent No.: US 11,476,356 B2
(45) Date of Patent: Oct. 18, 2022

(54) FIN FIELD-EFFECT TRANSISTOR DEVICE WITH LOW-DIMENSIONAL MATERIAL AND METHOD

(71) Applicant: Taiwan Semiconductor Manufacturing Co., Ltd., Hsinchu (TW)

(72) Inventors: Yi-Tse Hung, Hsinchu (TW); Chao-Ching Cheng, Hsinchu (TW); Tse-An Chen, Taoyuan (TW); Hung-Li Chiang, Taipei (TW); Tzu-Chiang Chen, Hsinchu (TW); Lain-Jong Li, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 53 days.

(21) Appl. No.: 16/887,729

(22) Filed: May 29, 2020

(65) Prior Publication Data

US 2021/0376133 A1 Dec. 2, 2021

(51) Int. Cl.
*H01L 29/76* (2006.01)
*H01L 29/66* (2006.01)
*H01L 29/78* (2006.01)

(52) U.S. Cl.
CPC .... *H01L 29/7606* (2013.01); *H01L 29/66431* (2013.01); *H01L 29/66787* (2013.01); *H01L 29/785* (2013.01)

(58) Field of Classification Search
CPC combination set(s) only.
See application file for complete search history.

(56) References Cited

U.S. PATENT DOCUMENTS

| | | | |
|---|---|---|---|
| 6,852,576 B2 | 2/2005 | Lin et al. | |
| 10,580,865 B2 | 3/2020 | Rachmady et al. | |
| 10,879,351 B2 | 12/2020 | Ching et al. | |
| 2010/0123128 A1 | 5/2010 | Jeon et al. | |
| 2013/0161587 A1 | 6/2013 | Xianyu et al. | |
| 2018/0175213 A1* | 6/2018 | Colinge | H01L 21/8256 |
| 2020/0006516 A1* | 1/2020 | Manipatruni | H01L 29/517 |
| 2020/0006573 A1* | 1/2020 | Lilak | H01L 29/785 |
| 2020/0335635 A1 | 10/2020 | Sharma et al. | |
| 2020/0343383 A1 | 10/2020 | Lee et al. | |

FOREIGN PATENT DOCUMENTS

| | | |
|---|---|---|
| KR | 20100054453 A | 5/2010 |
| KR | 20130073712 A | 7/2013 |
| TW | 200501393 A | 1/2005 |
| TW | 201335986 A | 9/2013 |
| TW | 201801321 A | 1/2018 |
| TW | 201824395 | 7/2018 |
| TW | 201913819 A | 4/2019 |
| WO | 2019182597 A1 | 9/2019 |

* cited by examiner

*Primary Examiner* — Moin M Rahman
(74) *Attorney, Agent, or Firm* — Slater Matsil, LLP

(57) ABSTRACT

A method includes: forming a dielectric fin protruding above a substrate; forming a channel layer over an upper surface of the dielectric fin and along first sidewalls of the dielectric fin, the channel layer including a low dimensional material; forming a gate structure over the channel layer; forming metal source/drain regions on opposing sides of the gate structure; forming a channel enhancement layer over the channel layer; and forming a passivation layer over the gate structure, the metal source/drain regions, and the channel enhancement layer.

20 Claims, 20 Drawing Sheets

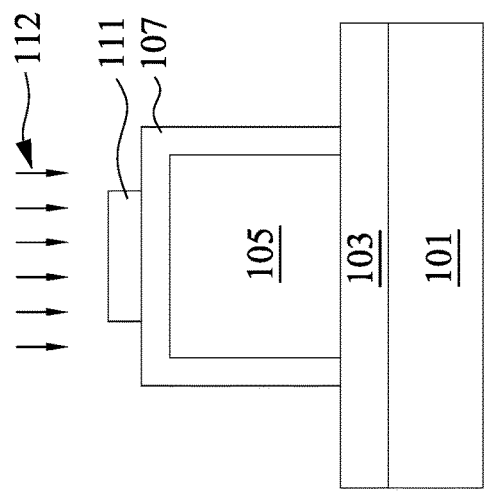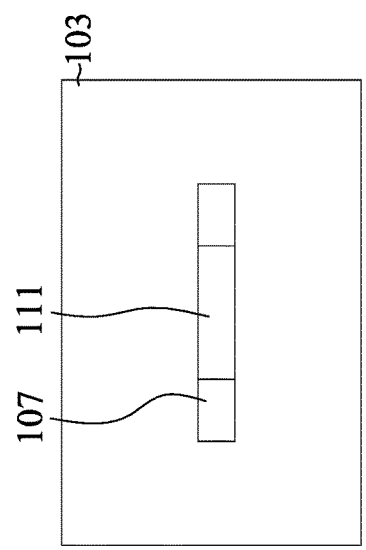
Fig. 5A
Fig. 5B

FIN FIELD-EFFECT TRANSISTOR DEVICE WITH LOW-DIMENSIONAL MATERIAL AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As feature size continues to shrink in semiconductor manufacturing process, more challenges arise that need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 2A, 2B, 3A, 3B, 4A, 4B, 5A, 5B, 6A-6C, 7A, 7B, 8A-8C, 9A, 9B, 10A, 10B, 11, 12A, 12B, 13A-13C, and 14A-14C illustrate cross-sectional views of a fin field-effect transistor (FinFET) device at various stages of manufacturing, in accordance with an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Throughout the discussion herein, unless otherwise specified, the same or similar reference number in different figures refers to the same or similar component formed by a same or similar process using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a fin field-effect transistor (FinFET) device is formed by forming a dielectric fin protruding above a substrate, and forming a channel layer over an upper surface of the dielectric fin and along first sidewalls of the dielectric fin, where the channel layer comprises a low-dimensional material. Next, a gate structure is formed over the channel layer, and metal source/drain regions are formed on opposing sides of the gate structure. Next, a channel enhancement layer is formed over the channel layer, and a passivation layer is formed over the gate structure, the metal source/drain regions, and the channel enhancement layer.

FIGS. 1A, 1B, 2A, 2B, 3A, 3B, 4A, 4B, 5A, 5B, 6A-6C, 7A, 7B, 8A-8C, 9A, 9B, 10A, 10B, 11, 12A, 12B, 13A-13C, and 14A-14C illustrate cross-sectional views of a fin field-effect transistor (FinFET) device 100 at various stages of manufacturing, in accordance with an embodiment. Throughout the discussion herein, figures with the same number but different alphabets (e.g., FIGS. 1A and 1B) illustrate cross-sectional views of a same device at a same stage of manufacturing, but along different cross-sections. In addition, figures with the same alphabet (e.g., FIGS. 1A and 2A) illustrate cross-sectional views along the same cross-section.

Figure 1A:
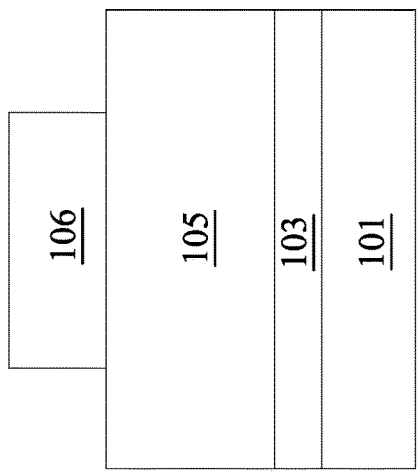
Figure 1B:
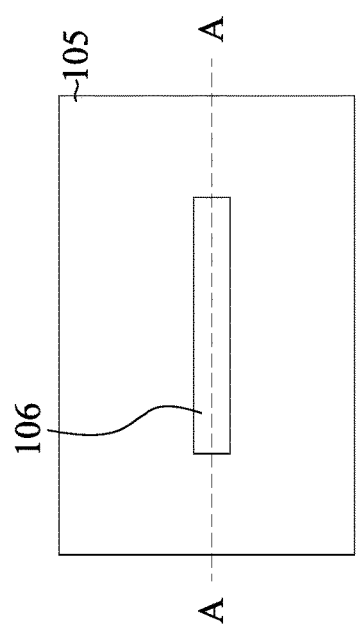

Referring to FIG. 1A, a dielectric layer 103 and a dielectric layer 105 are formed successively over a substrate 101. Next, a patterned mask layer 106, such as a patterned photoresist, is formed over the dielectric layer 105. An etching process 102 is then performed to pattern the dielectric layer 105 using the patterned mask layer 106 as the patterning mask. FIG. 1B illustrates the top view of the FinFET device 100 of FIG. 1A, and FIG. 1A illustrates the cross-sectional view of the FinFET device 100 along cross-section A-A in FIG. 1B.

The substrate 101 may be a semiconductor substrate, such as a bulk semiconductor, a semiconductor-on-insulator (SOI) substrate, or the like, which may be doped (e.g., with a P-type or an N-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. The substrate 101 may also be formed of other materials such as sapphire, indium tin oxide (ITO), or the like.

The dielectric layer 103 is formed of a suitable dielectric material and may function as an etch stop layer (e.g., a reactive-ion-etch (RIE) self-stopping layer) in the subsequent etching process 102. For example, the dielectric layer 103 may be formed of a dielectric material different from that of the dielectric layer 105 to provide etching selectivity. Examples materials for the dielectric layer 103 include silicon nitride, silicon carbonitride, silicon oxycarbonitride, or the like. The dielectric layer 103 may be formed by a suitable formation method such as chemical vapor deposition (CVD), physical vapor deposition (PVD), plasma enhanced chemical vapor deposition (PECVD), or the like.

In some embodiments, the dielectric layer 105 is formed of a low-K dielectric material, such as a dielectric material having a k-value lower than about 3.0. Example materials for the dielectric layer 105 include silicon oxide, fluorine-doped silicon oxide, carbon-doped silicon oxide, porous silicon oxide, two-dimensional (2D) insulator material (e.g., hexagonal boron nitride (hBN)), or the like. A suitable formation method, such as CVD, PVD, or the like, may be used to form the dielectric layer 105. The low-K dielectric material of the dielectric layer 105 may help to achieve a better electrostatic control for the FinFET device formed. In addition, the low-K dielectric material may help to achieve a better aspect ratio (e.g., width-to-height ratio) for the dielectric fin structure formed by the subsequent etching process.

FIG. 1A shows the dielectric layer 105 as a single layer as a non-limiting example. In some embodiments, the dielectric layer 105 has a multi-layered structure. For example, the dielectric layer 105 may include a layer of large band gap two-dimensional (2D) insulator material (e.g., hexagonal boron nitride (hBN)) and a layer of high-K dielectric material (e.g., $Al_2O_3$, $HfO_2$, or the like), where the 2D insulator material may suppress surface scattering due to its atomically smooth surface.

Still referring to FIGS. 1A and 1B, the patterned mask layer 106, such as a patterned photoresist layer, is formed over the dielectric layer 105. An etching process 102, such as an anisotropic etching process, is performed to pattern the dielectric layer 105. After the etching process, a dielectric fin structure 105 (see FIGS. 2A and 2B) is formed. For easy of discussion, the dielectric fin structure 105 may also be referred to as a dielectric fin 105, or simply a fin 105 in the discussion hereinafter.

The etching process 102 to form the dielectric fin structure 105 may be any acceptable etching process, such as a reactive ion etch (RIE), neutral beam etch (NBE), the like, or a combination thereof. The etching process is anisotropic, in the illustrated embodiment. The etching process etches the material of the dielectric layer 105 at a faster rate than the material of the dielectric layer 103, so that the etching stops at the dielectric layer 103 (also referred to as an isolation layer). After the etching process 102 is finished, the patterned mask layer 106 is removed by a suitable removal process, such as stripping or ashing.

Figure 2A:
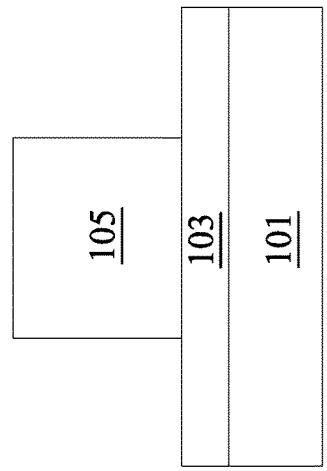
Figure 2B:
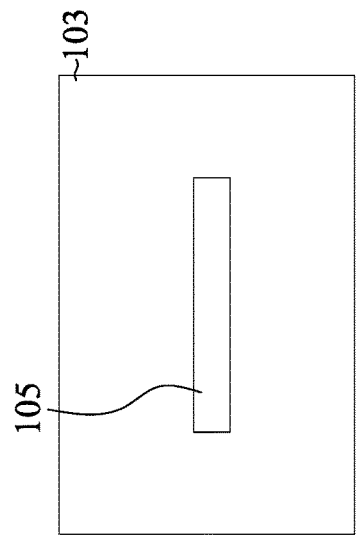

FIGS. 2A and 2B illustrate the dielectric fin 105 after the etching process 102. As illustrated in FIG. 2A, the dielectric fin 105 protrudes above the substrate 101 and the dielectric layer 103. In the example of FIGS. 2A and 2B, the dielectric fin 105 has a longitudinal axis along the horizontal direction of FIG. 2B (e.g., along the direction of cross-section A-A).

Figures 3A, 3B, 4A, 4B:
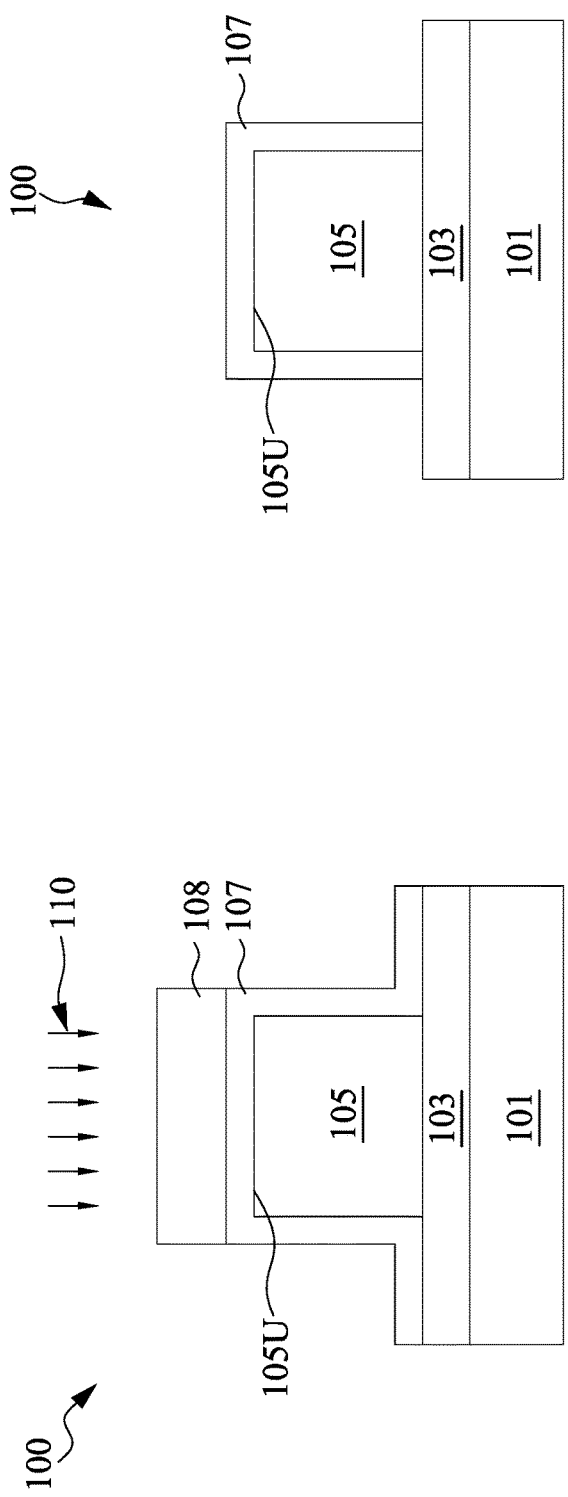

Next, in FIGS. 3A and 3B, a channel layer 107 (also referred to as a channel material) is conformally formed on the dielectric fins 105 and the dielectric layer 103. In some embodiments, the channel layer 107 comprises a low-dimensional material, such as a two-dimensional (2D) material, carbon nanotubes, graphene nanoribbons, or the like. Throughout the description, the term "low-dimensional" refers to layers whose thicknesses are small (e.g., atomically thin), for example, smaller than about 10 nm, smaller than about 5 nm, or smaller than about 1 nm. In some embodiments, the channel layer 107 has a thickness in the range of about 0.3 nm to about 1 nm, such as between about 0.3 nm and about 0.7 nm. In some embodiments, the channel layer 107 is a monolayer (e.g., one atomic layer). In some embodiments, the channel layer 107 has a dual-layered structure with two monolayers, and in subsequent processing, the upper monolayer is converted into a channel enhancement layer (see, e.g., 109 in FIG. 13A).

Low-dimensional materials can sustain high intrinsic mobility at very small thicknesses, e.g., down to one atomic layer. Atomically thin channel materials provide an ideal geometry for excellent electrostatic control. Atomically thin body could suppress short channel effects caused by aggressive device scaling in advanced processing nodes. In some embodiments, atomically thin channel materials can have a reasonable band gap size, such as around 1 eV, giving them a semiconducting behavior (e.g., being able to switch from an OFF state to an ON state, or vice versa, by a control voltage) with an OFF state (e.g., having little or no leakage current) while having great ON state performance (e.g., having high current density when in the ON state). Depending on the atomic structure, the low-dimensional materials may also be formed to have metallic or insulating behaviors. For example, low-dimensional materials such as octahedral phase structured transitional metal dichalcogenides (1T TMDs) behave as electrically conductive materials, and low-dimensional materials such as hexagonal boron nitride (hBN) behave as insulating materials.

Several types of low-dimensional materials (e.g., semiconducting low-dimensional materials) may be used to form the channel layer 107. Example low-dimensional materials for the channel layer 107 include carbon nanotube networks, aligned carbon nanotubes, one or more layers of semiconducting two-dimensional (2D) materials such as transition metal dichalcogenides (TMDs), graphene nanoribbons, or the like.

Low-dimensional material layers can be formed as described in U.S. patent application Ser. No. 16/837,261, which is incorporated herein by reference in its entirety. Carbon nanotube networks can be formed of single-wall carbon nanotubes (SWCNTs) grown by an immersion process. In a plan view, a carbon nanotube network may look like a plurality of straight (or slightly curved) tubes (with different lengths) placed randomly. Aligned carbon nanotubes can be grown using a carbon-containing precursor at a high temperature so that the precursor decomposes and carbon is grown. In a plan view, aligned carbon nanotubes have lengthwise directions generally aligned in the same direction, and can have similar lengths. A TMD layer includes the compound of a transition metal and a group-VIA element formed by a deposition method such as PECVD. The transition metal may be W, Mo, Ti, V, Co, Ni, Zr, Tc, Rh, Pd, Hf, Ta, Re, Ir, Pt, or the like. The group-VIA element may be sulfur (S), selenium (Se), tellurium (Te), or the like. Example TMD layers include $MoS_2$, $WS_2$, $WSe_2$, $MoSe_2$, $MoTe_2$, or the like. Graphene nanoribbons are strips of graphene that can be formed by graphite nanotomy, epitaxy, a deposition method such as CVD, or the like. It should be appreciated that other acceptable low-dimensional materials may be used. In embodiments where a low-dimensional material layer includes discrete elements, such as carbon nanotubes or graphene nanoribbons, the low-dimensional material layer can further include a dielectric material to fill the space between the discrete elements.

Still referring to FIGS. 3A and 3B, after the channel layer 107 is formed, a patterned mask layer 108, such as a patterned photoresist, is formed over the upper surface 105U of the dielectric fin 105. Next, an anisotropic etching process 110, such as a plasma etch process, is performed to remove horizontal portions (e.g., portions over the upper surface of the dielectric layer 103) of the channel layer 107 un-protected by the patterned mask layer 108. After the anisotropic etching process 110 is finished, the patterned mask layer 108 is removed by a suitable removal process, such as stripping or ashing.

FIGS. 4A and 4B illustrate the FinFET device 100 after the processing of FIGS. 3A and 3B. As illustrated in FIGS. 4A and 4B, the channel layer 107 covers the upper surface 105U of the dielectric fin 105 and sidewalls of the dielectric fin 105.

Next, in FIGS. 5A and 5B, a patterned mask layer 111, such as a patterned photoresist, is formed over the upper surface of the channel layer 107. Next, an anisotropic etching process 112, such as a plasma etching process, is performed to pattern the dielectric fin 105 and the channel layer 107, such that portions of the dielectric fin 105 and the channel layer 107 disposed outside the boundaries (e.g., sidewalls) of the patterned mask layer 111 are removed. The anisotropic etching process 112 may be used to fine-tune the dimensions of the dielectric fin 105, or may be used to cut the dielectric fin 105 to separate it from other dielectric fins (not shown) located in other regions of the device formed. After the anisotropic etching process 112 is finished, the patterned mask layer 111 is removed by a suitable removal process, such as stripping or ashing.

Figure 6C:
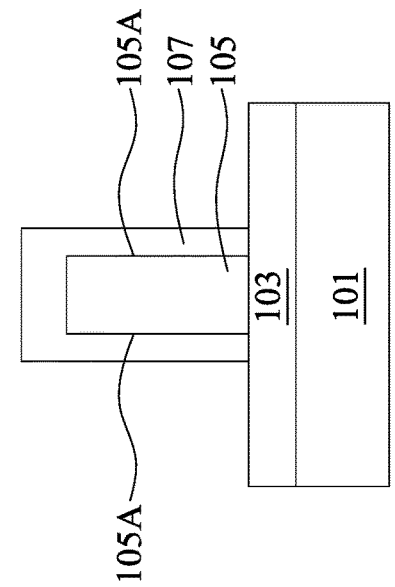
Figure 6A:
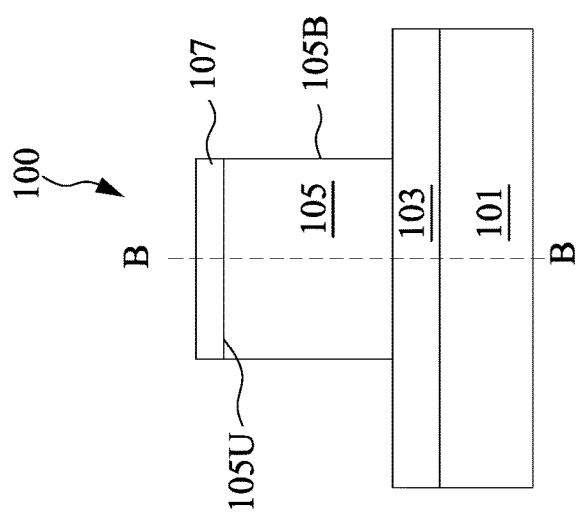
Figure 6B:
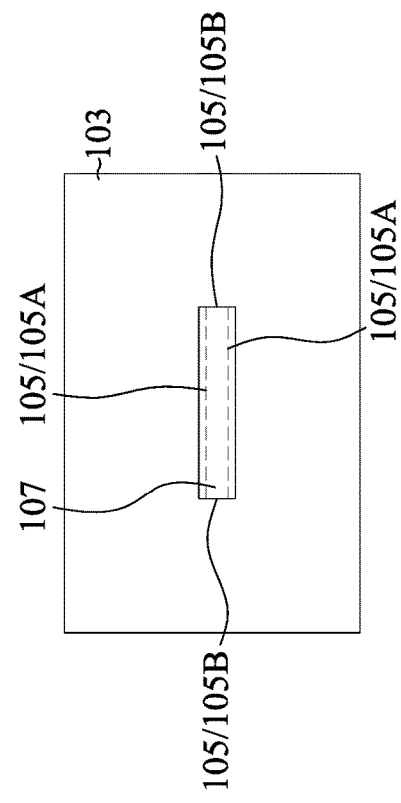

FIGS. 6A-6C illustrate the FinFET device 100 after the processing of FIGS. 5A and 5B. Note that FIG. 6C illustrates the cross-sectional view of the FinFET device 100 along cross-section B-B in FIG. 6A. The dielectric fin 105 is shown in dashed lines in the top view illustrated in FIG. 6B.

As illustrated in FIGS. 6A-6C, after the anisotropic etching process 112, the channel layer 107 covers the upper surface 105U of the dielectric fin 105 and first sidewalls 105A of the dielectric fin 105, while second sidewalls 105B are not covered (e.g., exposed) by the channel layer 107.

Figure 7A:
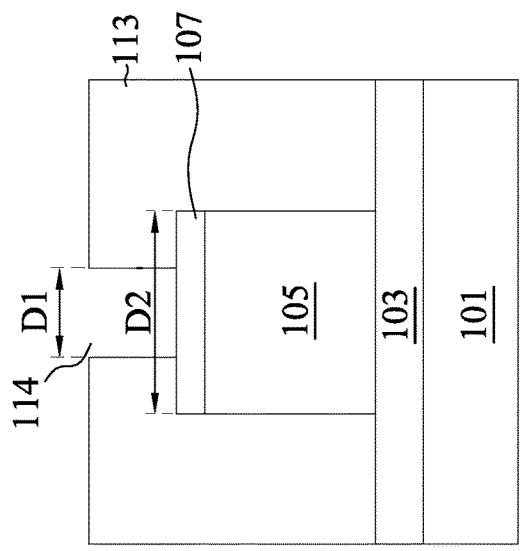
Figure 7B:
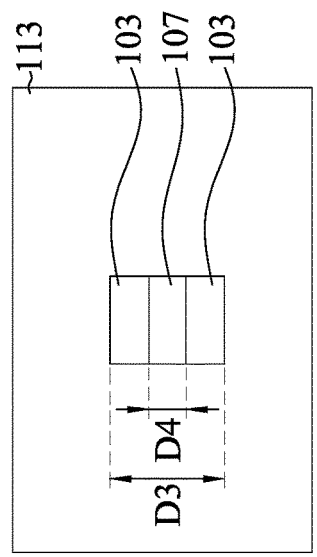

Next, in FIGS. 7A and 7B, a patterned mask layer 113, such as a patterned photoresist, is formed over the structure shown in FIGS. 6A-6C. An opening 114 of the patterned mask layer 113 has a length D1 smaller than a length D2 of the dielectric fin 105, and exposes a portion of the upper surface of the channel layer 107. In addition, as illustrated in FIG. 7B, the opening 114 has a width D3 larger than a width D4 of the channel layer 107, and exposes a portion of the upper surface of the dielectric layer 103 underlying the opening 114.

Figure 8C:
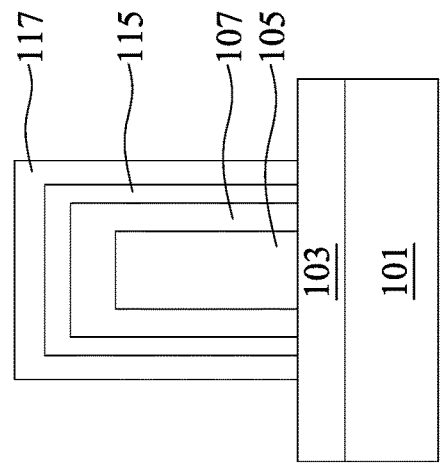
Figure 8A:
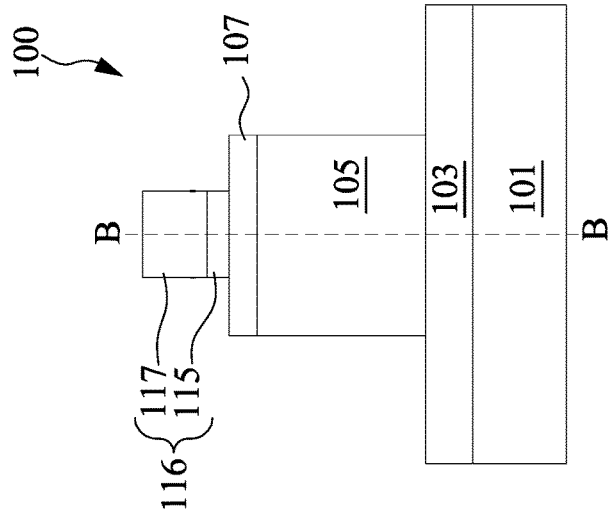
Figure 8B:
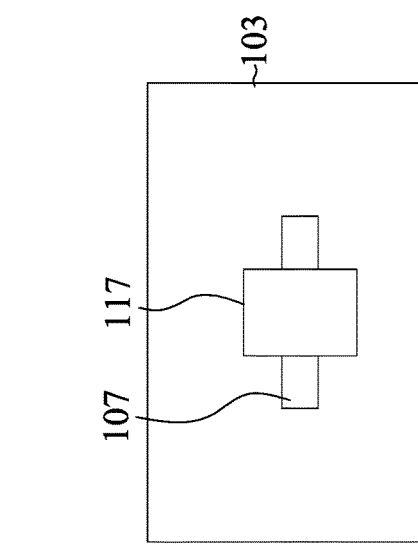

Next, in FIGS. 8A-8C, a gate structure 116 is formed in the opening 114 (see FIG. 7A) of the patterned mask layer 113 over the dielectric fin 105 and over the channel layer 107. In some embodiments, the gate structure 116 is a metal gate structure, and includes a gate dielectric layer 115 and a gate electrode 117. The gate dielectric layer 115 may be, for example, silicon oxide, silicon nitride, multilayers thereof, or the like, and may be deposited according to acceptable techniques. In some embodiments, the gate dielectric layer 115 is a high-k dielectric material, and in these embodiments, the gate dielectric layer 115 may have a K-value greater than about 7.0, and may include a metal oxide or a silicate of Hf, Al, Zr, La, Mg, Ba, Ti, Pb, multilayers thereof, and combinations thereof. The formation methods of the gate dielectric layer 115 may include molecular-beam deposition (MBD), atomic layer deposition (ALD), plasma-enhanced CVD (PECVD), and the like. In some embodiments, the gate dielectric layer 115 is formed of $SiO_2$, a high-K dielectric material (e.g., $Al_2O_3$, $HfO_2$), an insulating large band gap 2D material (e.g., hBN), or combinations thereof. A thickness of the gate dielectric layer 115 may be between about 0.5 nm and about 15 nm. As illustrated in FIGS. 8A-8C, the gate dielectric layer 115 is conformally formed over the dielectric fin 105 and over the channel layer 107.

Next, the gate electrode 117 is formed over the gate dielectric layer 115 and fills the remaining portion of the opening 114 (see FIG. 7A) of the patterned mask layer 113. The gate electrode 117 may be formed of a metal or a metal-containing material such as Cu, Al, W, the like, combinations thereof, or multi-layers thereof, and may be formed by, e.g., electroplating, electroless plating, PVD, CVD, or other suitable method. After the gate electrode 117 is formed, a planarization process, such as a chemical mechanical polishing (CMP), may be performed to remove excess portions of the gate dielectric layer 115 and the material of the gate electrode 117 from the upper surface of the patterned mask layer 113. The resulting remaining portions of material of the gate electrode 117 and the gate dielectric layer 115 thus form the gate structure 116 of the FinFET device 100. The patterned mask layer 113 may then be removed by a suitable removal process, such as stripping or ashing.

Figure 9A:
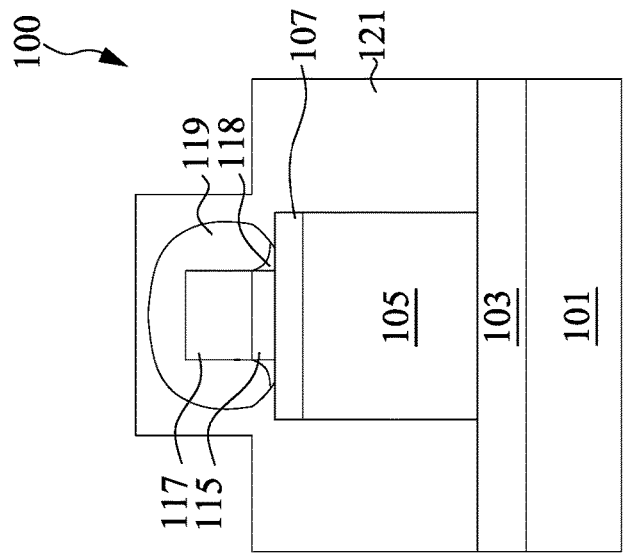
Figure 9B:
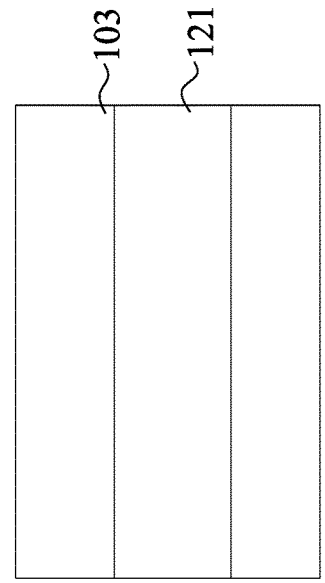
Figure 23:
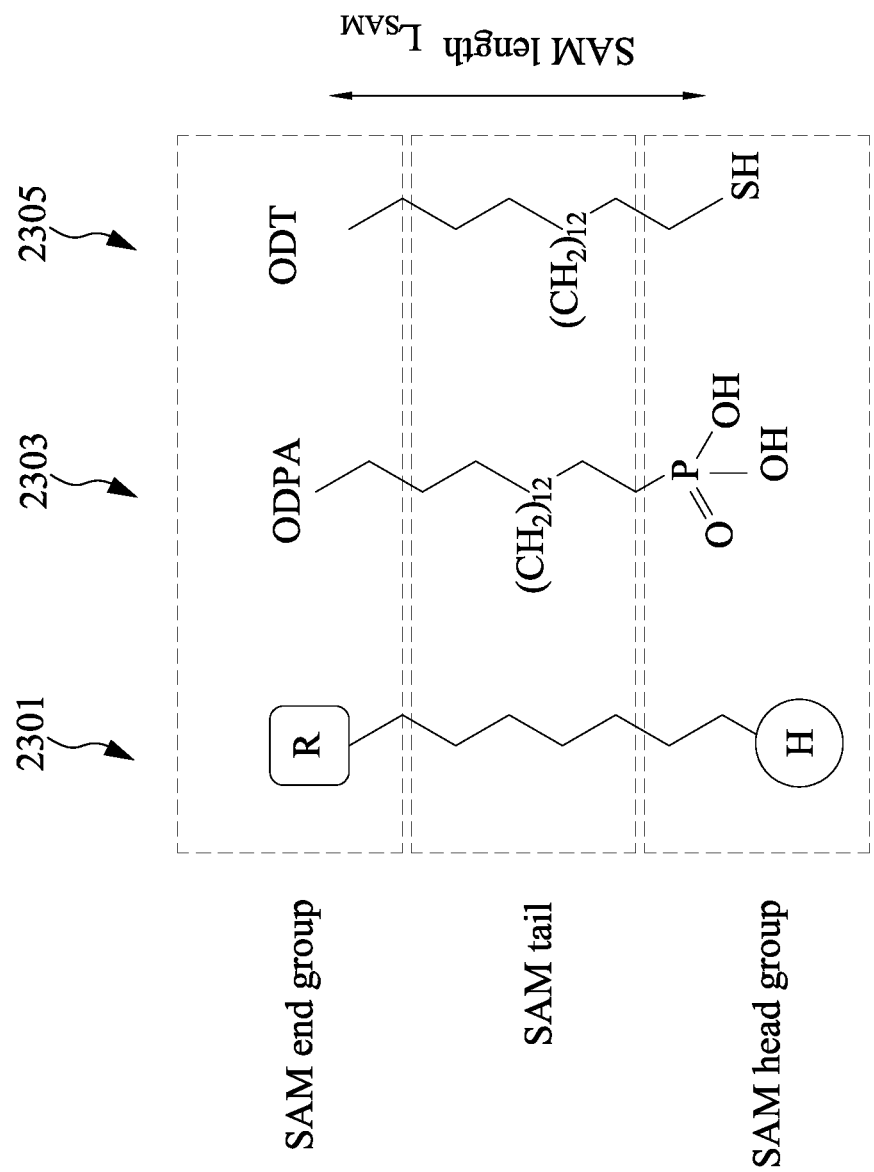
FIG. 23 illustrates structures of self-aligned molecules, in some embodiments.

Next, in FIGS. 9A and 9B, a self-assembled molecule (SAM) layer 119 is formed, e.g., selectively, over the upper surface and sidewalls of the gate electrode 117. The SAM layer 119 comprises a plurality of self-assembled molecules attached to the upper surface and sidewalls of the gate electrode 117. FIG. 23 illustrates an example of self-aligned molecule of the SAM layer.

Referring temporarily to FIG. 23, which illustrates a generic model 2301 for the self-aligned molecule. The generic model 2301 includes a SAM head group H, an SAM end group R, and an SAM tail between the SAM head group H and the SAM end group R. The SAM head group H is attached to a surface (e.g., the upper surface or sidewalls of the gate electrode 117), the SAM end group R is attached to the SAM head group H by the SAM tail and sticks out from the attached surface like, e.g., a needle or a fiber, in some embodiments. The length $L_{SAM}$ of the SAM molecules in the SAM layer 119 (see FIG. 9A) determines the thickness of the SAM layer 119. FIG. 23 further illustrates two examples SAM molecules 2302 and 2305, which have different SAM head groups and SAM end groups.

Referring back to FIGS. 9A and 9B, the type of SAM molecules used to form the SAM layer 119 is chosen such that the SAM head group H of the SAM molecules attaches to metal only. In other words, the SAM molecules are chosen such that the SAM layer 119 is selectively formed on (e.g., attached to) the upper surface and the sidewalls of the gate electrode 117. Examples SAM molecules suitable for use in the SAM layer 119 include alkanethiols or organophosphonic acids. In some embodiments, the SAM layer 119 is formed by dipping the gate electrode 117 in an SAM solution comprising the SAM molecules. As discussed above, the length $L_{SAM}$ of the SAM molecules determines the thickness $L_{SAM}$ of the SAM layer 119, which in turn determines the distance between the gate structure 116 and the subsequently formed source/drain regions 121, as discussed in more detail later. The thickness $L_{SAM}$ of the SAM layer 119 may be in a range from 3 angstroms to about 30 angstroms. FIG. 9A further illustrates the thickness $L_{SAM}$ of the SAM layer 119, the gate length $L_g$ of the FinFET device 100, and the channel length $L_ch$ of the FinFET device 100. In the illustrated example, the relation between the gate length $L_g$, the channel length $L_ch$, and the thickness $L_{SAM}$ of the SAM layer is described by: $L_{ch}=L_g+2\times L_{SAM}$.

Figure 10A:
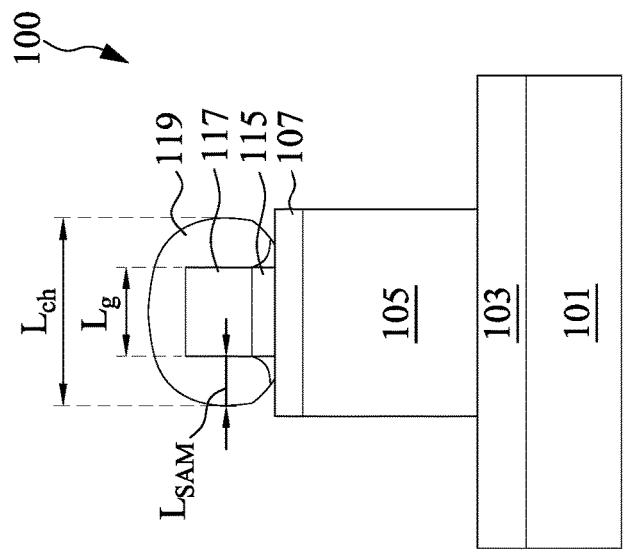
Figure 10B:
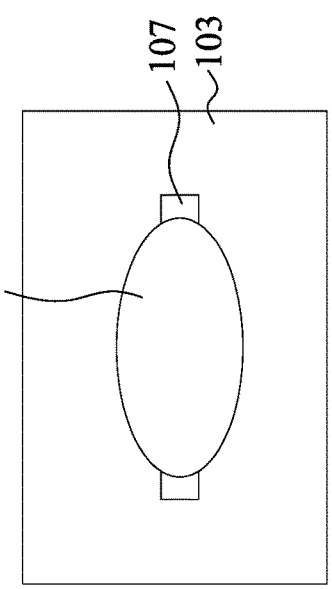

Next, in FIGS. 10A and 10B, a metal layer 121 is formed over the structure of FIGS. 9A and 9B. Depending on the type (e.g., N-type or P-type) of device formed, the metal layer 121 may be formed of an N-type metal or a P-type metal. Example materials for the metal layer 121 include group IIIB metals (e.g., Sc), group IVB metals (e.g., Ti), group VB metals (e.g., Nb), group VIB metals (e.g., Cr, W), group VIIIB metals (e.g., Ni, Pd, Pt), group IB metals (e.g., Ag, Au), group IIIA metals (e.g., Al), or the like. In some embodiments, Sc, Ti, Cr, Ni, Al, or the like, is used as the N-type metal for forming the metal layer 121. In some embodiments, Nb, Pd, Pt, Au, or the like, is used as the P-type metal for forming the metal layer 121. The metal layer 121 may be formed of a suitable formation method such as PVD, CVD, ALD, or the like. Note that gaps 118 exist on opposing sides of the gate electrode 117 directly under the SAM layer 119, due to the SAM layer 119 blocking those areas from the metal layer 121. The size of the gap 118 is determined by the width $L_{SAM}$ of the SAM layer 119, in the illustrated embodiment.

Figure 11:
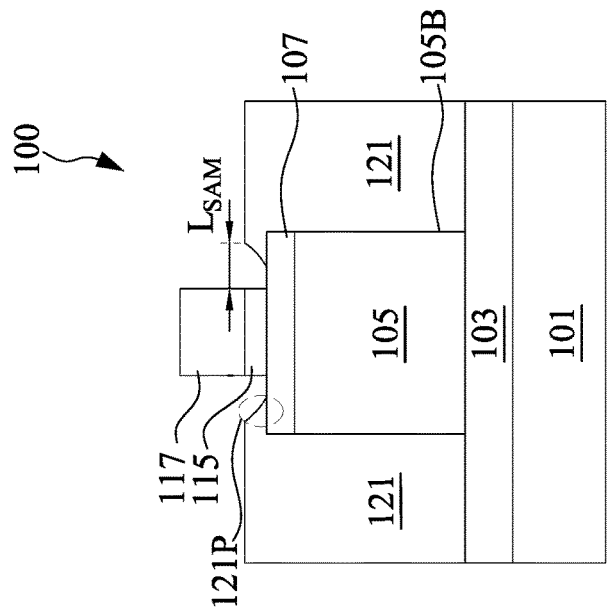

Next, in FIG. 11, an adhesive tape 123 is attached to the upper surface of the metal layer 121. Next, the adhesive tape 123 is peeled off. The SAM layer 119 and an upper portion (e.g., an upper layer) of the metal layer 121 are removed with the peeled tape.

Figure 12A:
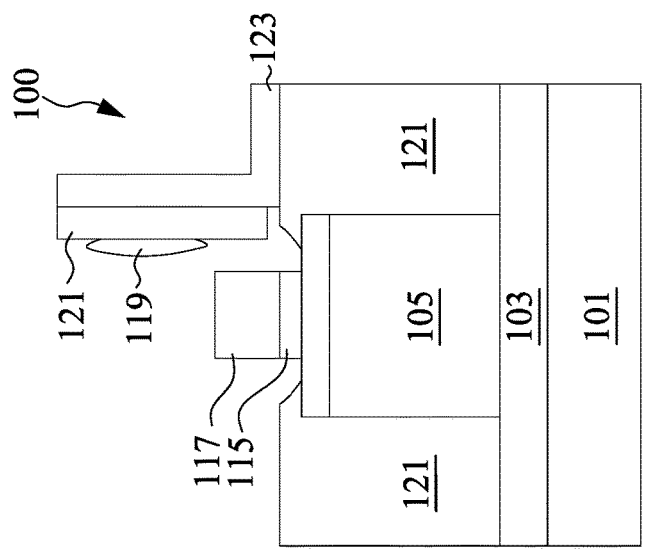
Figure 12B:
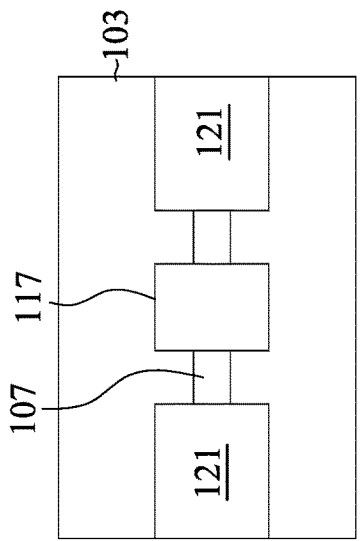

FIGS. 12A and 12B illustrate the FinFET device 100 after the adhesive tape 123 is peeled off. The remaining portion of the metal layer 121 form source/drain regions 121 of the FinFET device 100. Since the source/drain regions 121 are formed of a metal material(s), the source/drain regions 121 may also be referred to as metal source/drain regions.

As illustrated in FIGS. 12A and 12B, there is a gap between the gate electrode 117 and the source/drain regions 121. A width of the gap, measured between the gate electrode 117 and the source/drain regions 121 at an upper surface of the source/drain regions 121, is a same as the thickness $L_{SAM}$ of the SAM layer 119 (or the length $L_{SAM}$ of the SAM molecule), in the illustrated embodiment. In FIG. 12A, the source/drain regions 121 extend along and contact second sidewalls 105B of the dielectric fin 105. In addition, the source/drain regions 121 extend along an upper surface of the dielectric fin 105 and along an upper surface of the channel layer 107 in FIG. 12A. In other words, the source/drain regions 121 in FIG. 12A have a protrusion 121P that is disposed over the upper surface of the dielectric fin 105 (or the upper surface of the channel layer 107). The shape of the source/drain regions 121 illustrated in FIGS. 12A and 12B is merely a non-limiting example. Depending on the thickness of the SAM layer 119 (e.g., $L_{SAM}$), other shapes of the source/drain regions 121 may be possible (see, e.g., FIG. 15A), these and other variations are fully intended to be included within the scope of the present disclosure.

Figure 13C:
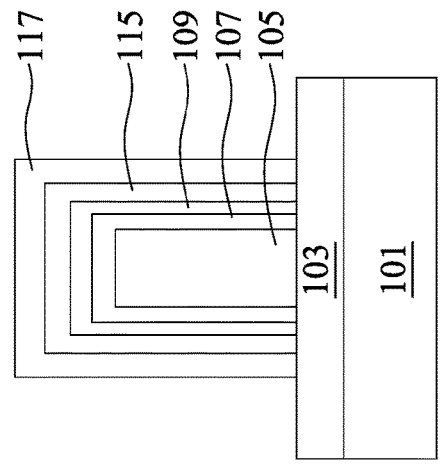
Figure 13A:
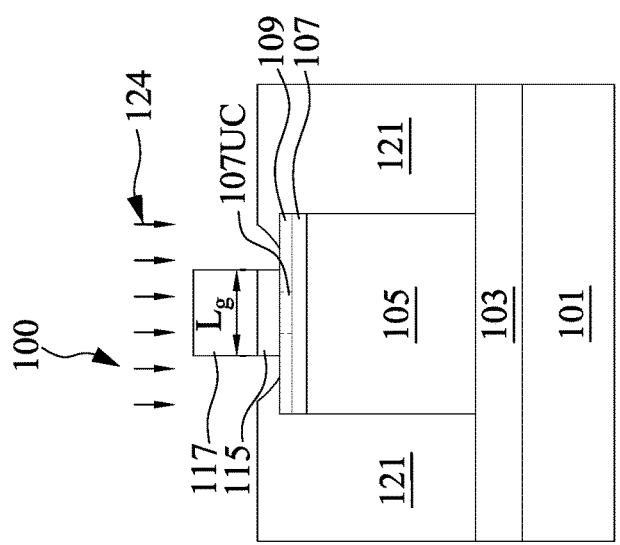
Figure 13B:
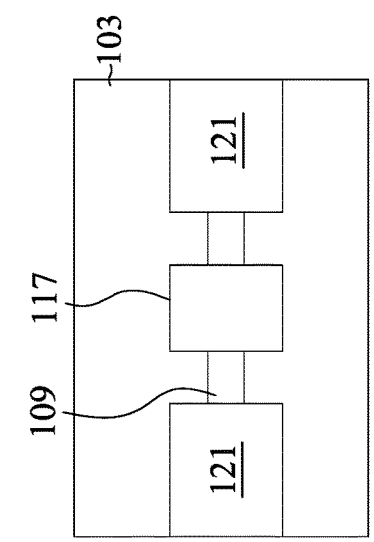

Next, in FIGS. 13A-13C, a doping process 124 is performed to convert an upper layer of the channel layer 107 into a channel enhancement layer 109. In some embodiments, through the doping processes 124, such as charge exchanging, virtual gating, or the like, the channel enhancement layer 109 is functionalized, and as a result, transport charge carriers (e.g., electrons or holes) are induced in the channel enhancement layer 109. In the example of FIGS. 13A-13C, the channel layer 107 has a dual-layered structure, which has two monolayers of a 2D low-dimensional material. The upper layer (e.g., the upper monolayer) of the channel layer 107 is doped by the doping process 124 to form a doped layer of the channel layer 107 (e.g., the channel enhancement layer 109). In some embodiments, the doping process 124 is a plasma process performed using a gas source comprising $O_2$, $N_2$, nitric oxide (NO), or the like. In the illustrated embodiment, the gas source comprises $O_2$ gas, which is then ignited into $O_2$ plasma, and the $O_2$ plasma reacts with (e.g., oxidizes) the upper layer of the channel layer 107, and converts the upper layer into the channel enhancement layer 109 (e.g., an oxide of the channel layer). For example, the channel layer 107 may be formed of a material comprising W or Mo, and the $O_2$ plasma converts the upper layer of the channel layer 107 into $WO_x$ or $MoO_x$. In some embodiments, the doping process is performed by applying a chemical solution (e.g., $AuCl_3$ solution) to the channel layer 107, such that the upper layer of the channel layer 107 is converted into the channel enhancement layer 109. For example, the channel layer 107 (or the FinFET device 100) may be dipped into the chemical solution for the doping process. In some embodiments, a nitric oxide gas annealing process is performed to convert the upper layer of the channel layer 107 into the channel enhancement layer 109. Besides the doping process described above, other methods to form the channel enhancement layer 109 are possible (see, e.g., FIGS. 16A-16B and discussion thereof) and are fully intended to be included within the scope of the present disclosure.

Still referring to FIGS. 13A-13C, depending on the gate length $L_g$ of the gate structure, portions of the channel layer 107, such as portions of the upper layer of the channel layer 107 directly under the gate electrode 117, may or may not be converted into the channel enhancement layer 109. FIG. 13A illustrates an example where the upper layer of the channel layer 107 is completely converted into the channel enhancement layer 109. In some embodiments, the gate electrode 117 may block a portion (e.g., 107UC) of channel layer 107 directly under it from the doping process 124, and therefore, the portion 107UC (illustrated by dashed lines) of the upper layer of the channel layer 107 is not converted into the channel enhancement layer 109, while other portions of the upper layer of the channel layer 107 are converted into the channel enhancement layer 109.

Figure 14A:
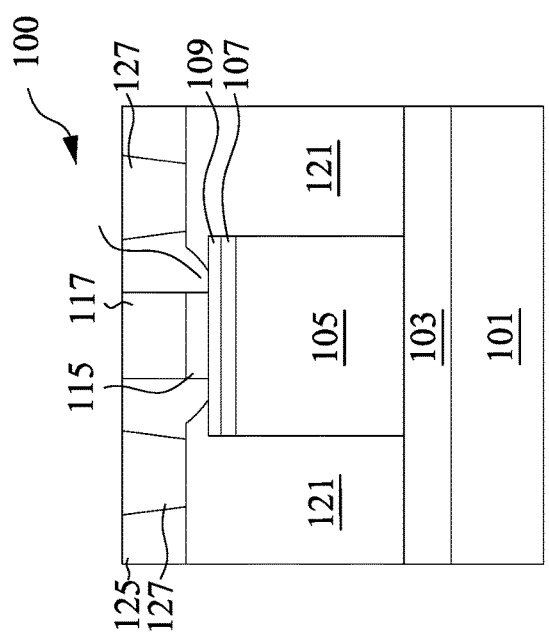
Figure 14C:
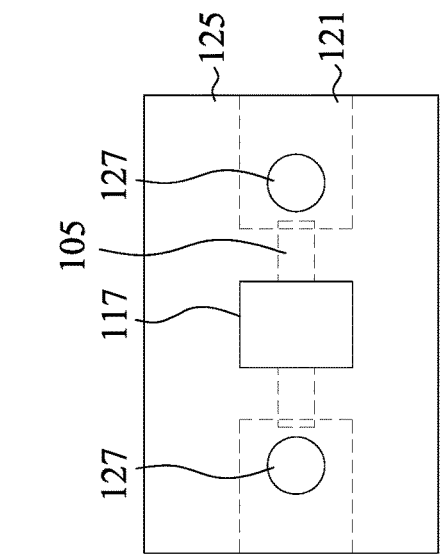
Figure 14B:
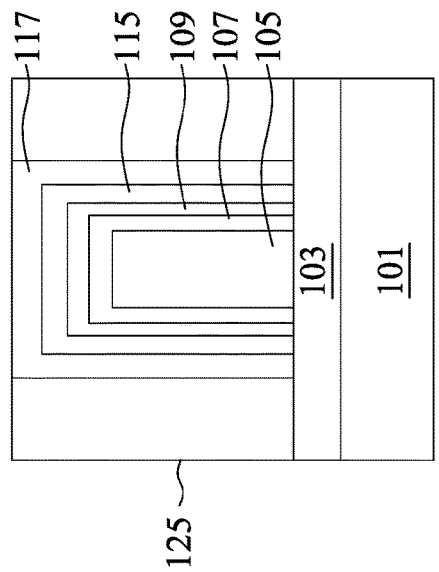

Referring next to FIGS. 14A-14C, a passivation layer 125 is formed over the structure of FIGS. 13A-13C, and contacts 127 are formed in the passivation layer 125 to electrically couple to the source/drain regions 121.

In some embodiments, the passivation layer 125 comprises a suitable dielectric material such as silicon oxide, a high-K dielectric material (e.g., $Al_2O_3$, $HfO_2$), an insulating large band gap 2D material (e.g., hBN), the like, or combinations thereof, formed by a suitable formation method such as PVD, CVD, ALD, or the like. Next, openings are formed in the passivation layer 125, e.g., by photolithography and etching techniques, to expose source/drain regions 121. Next, the contacts 127, also referred to as contact plugs or source/drain contacts, are formed in the openings. The contacts 127 may be formed of an electrically conductive material, such as Cu, Al, W, the like, combinations thereof, or multi-layers thereof, and may be formed by, e.g., electroplating, electroless plating, PVD, CVD, or other suitable method. FIG. 14B shows the top view of the FinFET device 100, where the dielectric fin 105 and the metal source/drain regions 121 are illustrated in dashed lines since they are not visible in the top view.

Additional process may follow the processing of FIGS. 14A-14C to complete the manufacturing of the FinFET device 100, as skilled artisans readily appreciate. For example, additional dielectric layers and additional conductive features (e.g., vias and metal lines) in the dielectric layers may be formed over the passivation layer 125 to form interconnect structures of the FinFET device 100. Details are not described here.

Figure 15C:
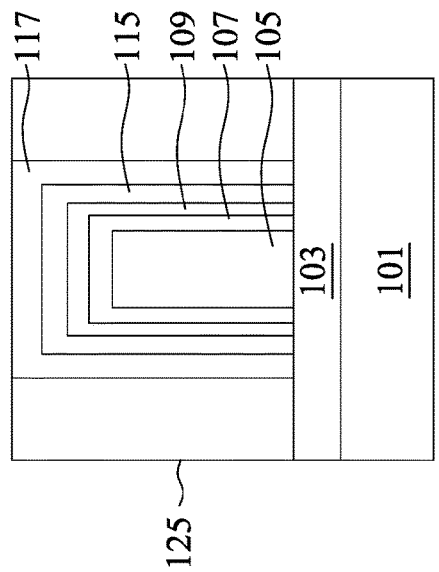
FIGS. 15A-15C illustrate cross-sectional views of a FinFET device, in accordance with an embodiment.
Figure 15A:
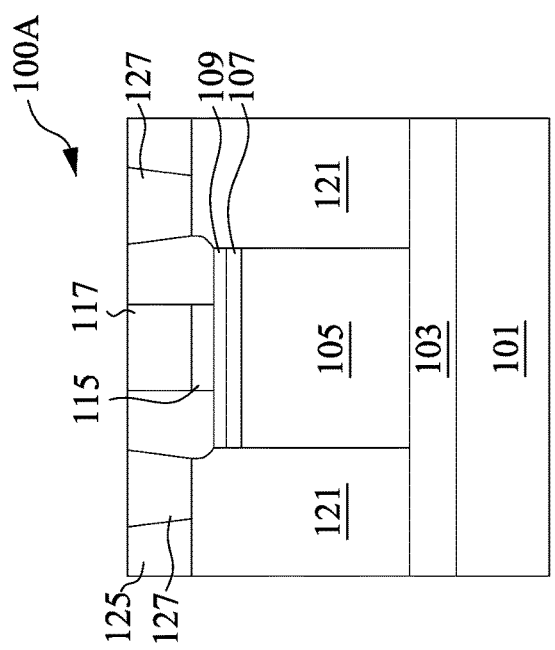
Figure 15B:
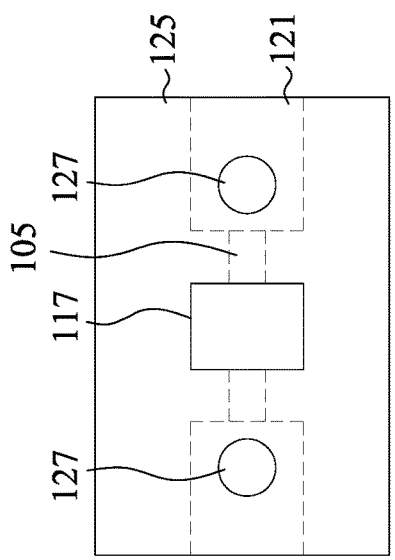

FIGS. 15A-15C illustrate cross-sectional views of a FinFET device 100A, in accordance with an embodiment. The FinFET device 100A is similar to the FinFET device 100 in FIGS. 14A-14C, but the metal source/drain regions 121 do not have the protrusion 121P (see label in FIG. 12A) formed over the upper surface of the dielectric fin 105. This may be achieved by increasing the thickness $L_{SAM}$ of the SAM layer 119 in the processing of FIG. 9A. As a result, the gap between the gate electrode 117 and the metal source/drain regions 121 is increased, and the metal source/drain regions 121 extends along the second sidewalls 105B of the dielectric fin 105 but do not extend along the upper surface of the dielectric fin 105.

Figure 16C:
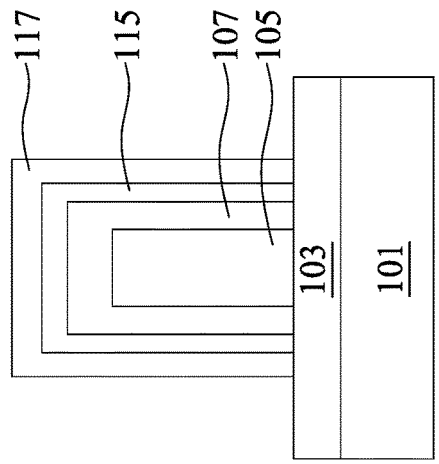
FIGS. 16A-16C and 17A-17C illustrate cross-sectional views of a FinFET device at various stages of manufacturing, in accordance with an embodiment.
Figure 16A:
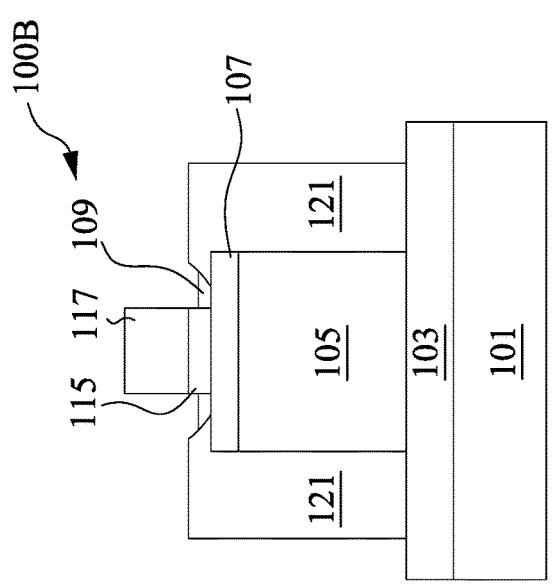
Figure 16B:
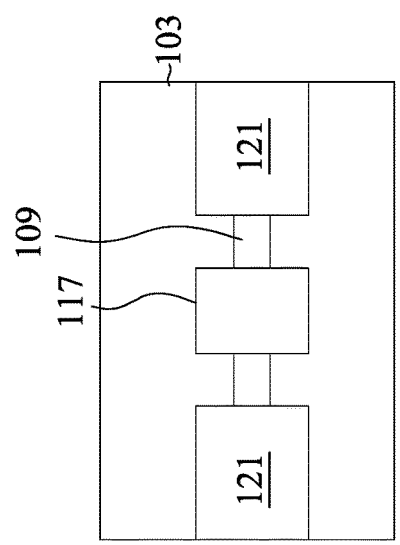

FIGS. 16A-16C and 17A-17C illustrate cross-sectional views of a FinFET device 100B at various stages of manufacturing, in accordance with an embodiment. The FinFET device 100B is similar to the FinFET device 100 in FIGS. 14A-14C, but the channel enhancement layer 109 of the FinFET device 100B is formed by a deposition process instead of the doping process for the FinFET device 100. In particular, in FIG. 16A, which corresponds to the processing of FIG. 13A for the FinFET device 100, the channel enhancement layer 109 of the FinFET device 100B is formed by depositing a layer of material (e.g., an oxide of the material of the channel layer 107) over the channel layer 107. In the example of FIGS. 16A-16C, the channel layer 107 is a single monolayer of a semiconducting 2D low-dimensional material. As illustrated in FIG. 16A, the channel enhancement layers 109 is formed on opposing sides of the gate electrode 117, and a lower surface of the channel enhancement layer 109 facing the substrate 101 is level with a lower surface of the gate dielectric layer 115 facing the substrate 101. Note that in FIGS. 16A-16C, the channel enhancement layer 109 is not formed under (e.g., directly under) the gate electrode 117.

Figure 17C:
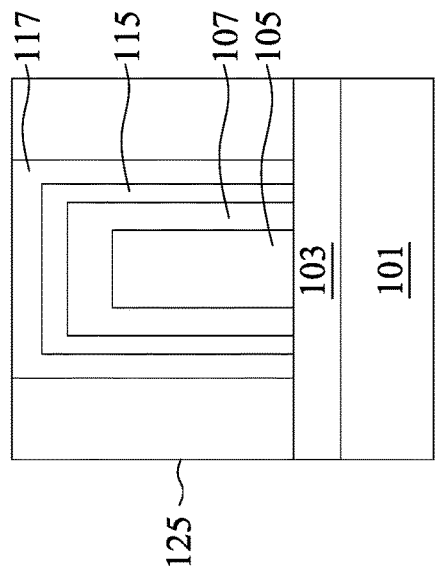
Figure 17A:
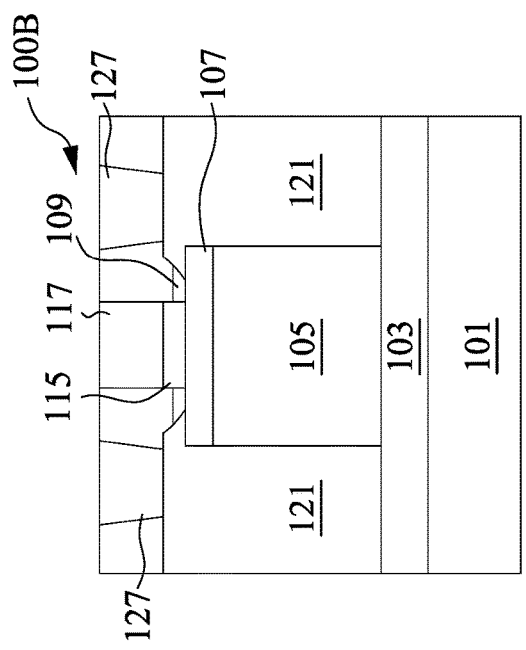
Figure 17B:
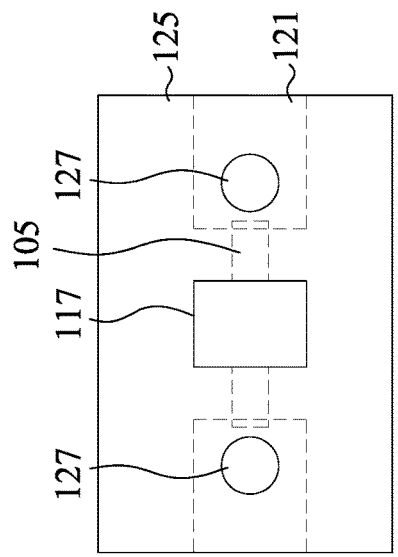

FIGS. 17A-17C shows the FinFET device 100B after the passivation layer 125 and the contacts 127 are formed. The processing is similar to that of FIGS. 14A-14C, thus details are not repeated.

Figure 18C:
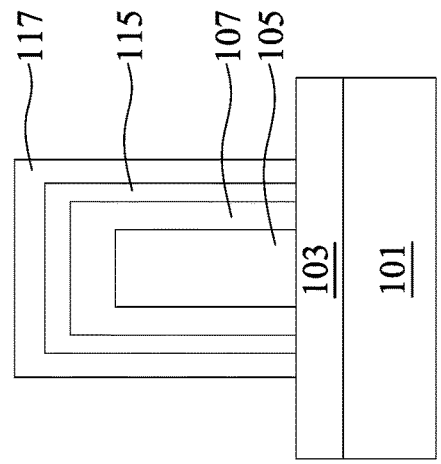
FIGS. 18A-18D and 19A-19D illustrate cross-sectional views of a FinFET device at various stages of manufacturing, in accordance with an embodiment.
Figure 18D:
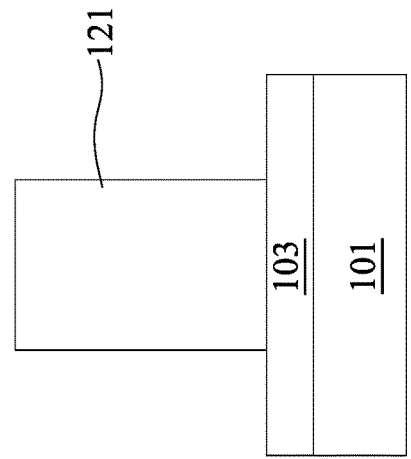
Figure 18A:
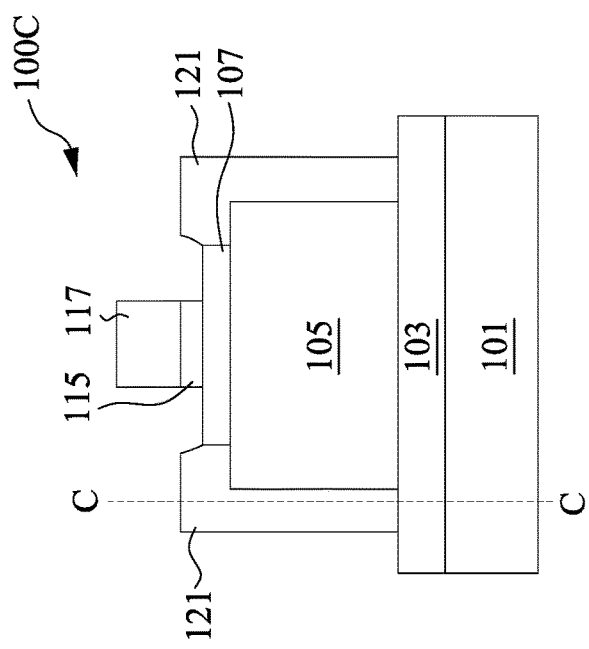
Figure 18B:
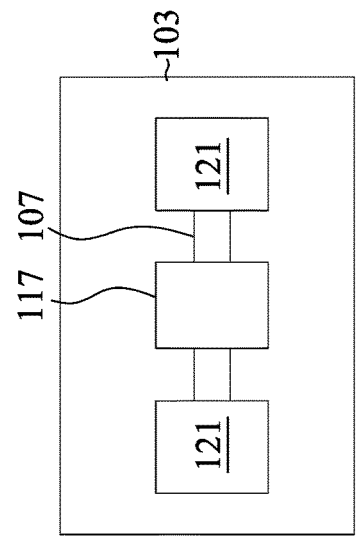
Figure 19C:
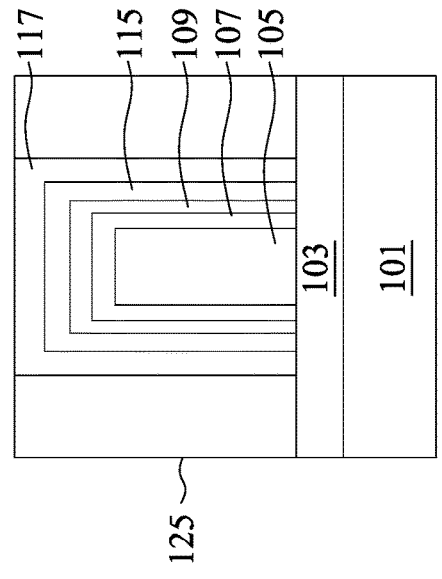
Figure 19D:
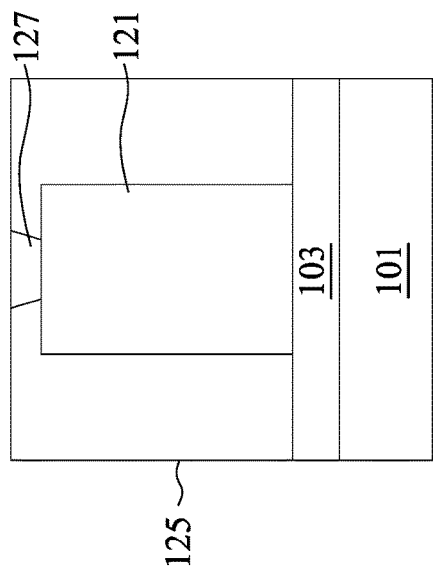
Figure 19A:
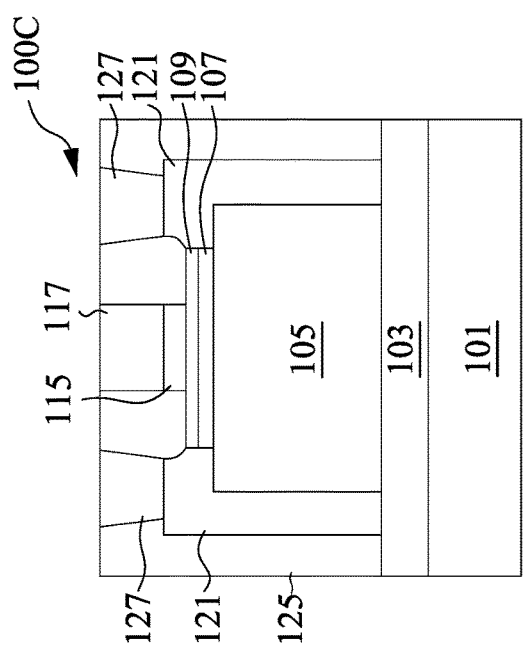
Figure 19B:
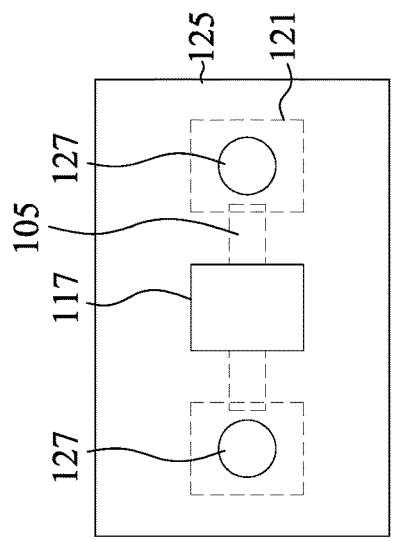
Figure 20A:
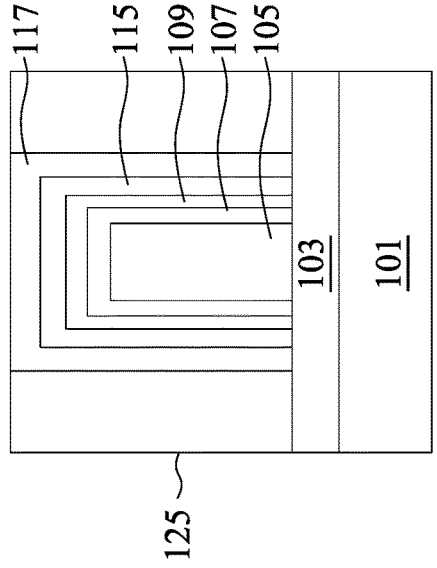
FIGS. 20A-20D illustrate cross-sectional views of a FinFET device, in accordance with another embodiment.
Figure 20C:
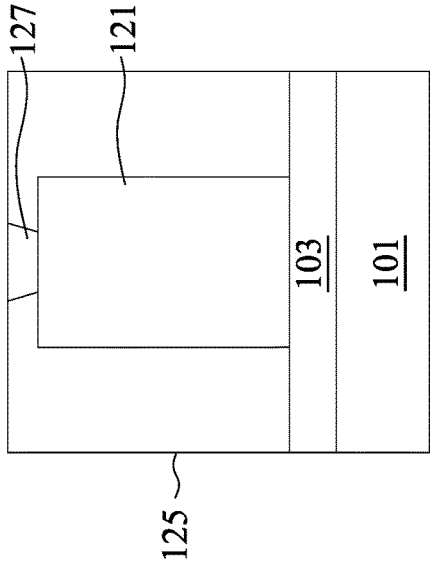
Figure 20B:
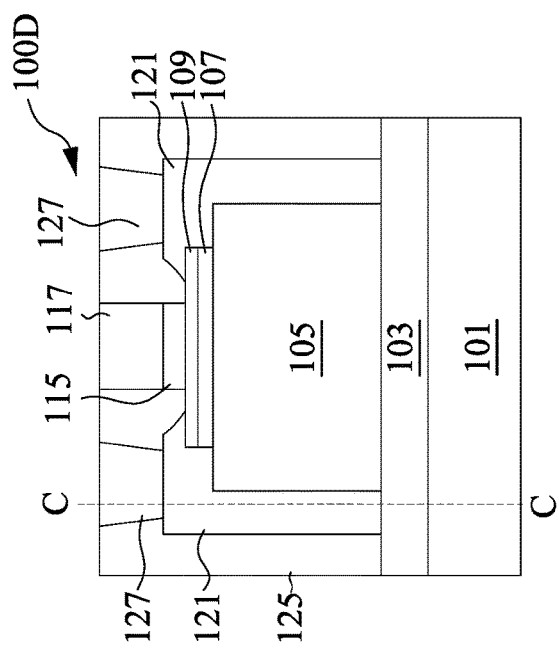
Figure 20D:
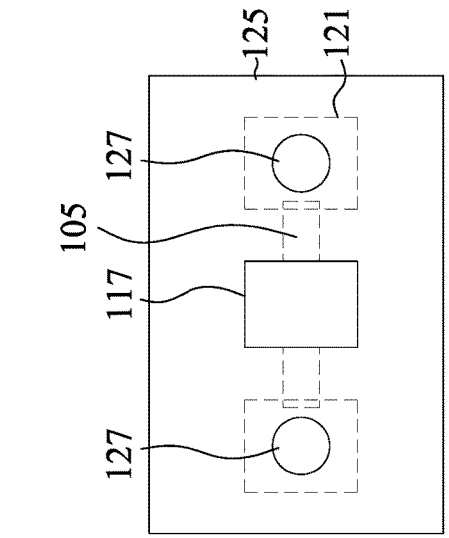
Figure 21A:
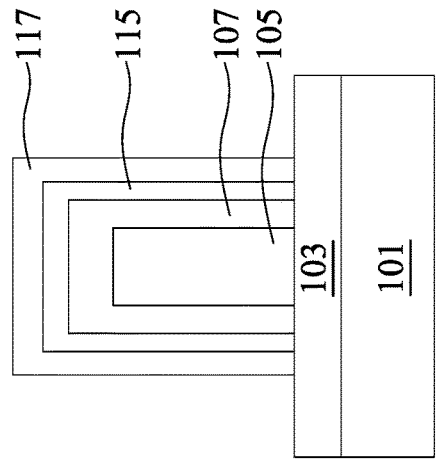
FIGS. 21A-21D and 22A-22D illustrate cross-sectional views of a FinFET device at various stages of manufacturing, in accordance with yet another embodiment.
Figure 21B:
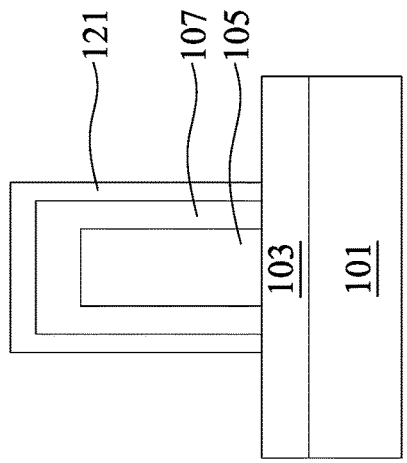
Figure 21C:
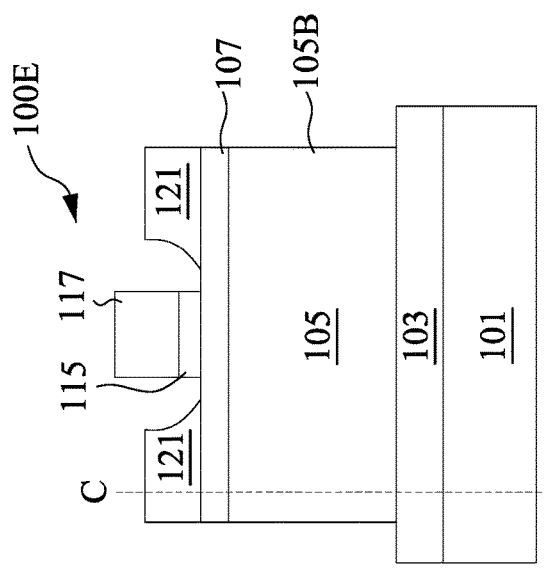
Figure 21D:
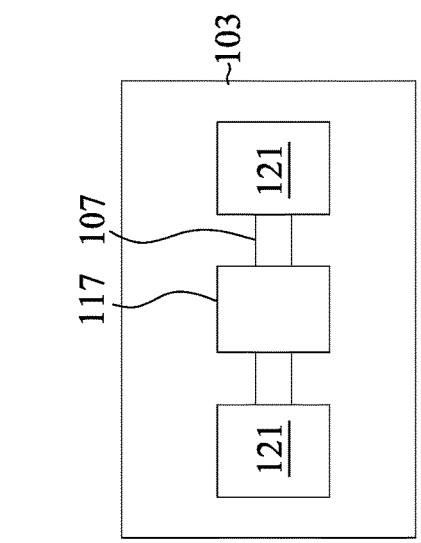
Figure 22A:
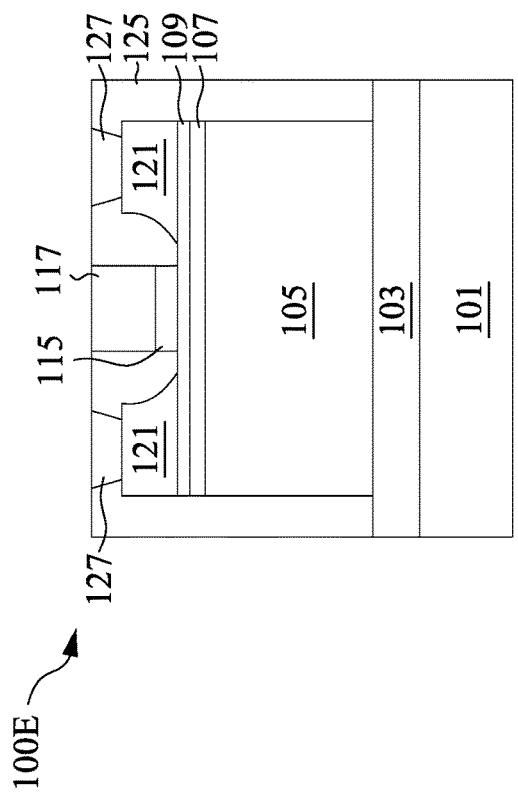
Figure 22B:
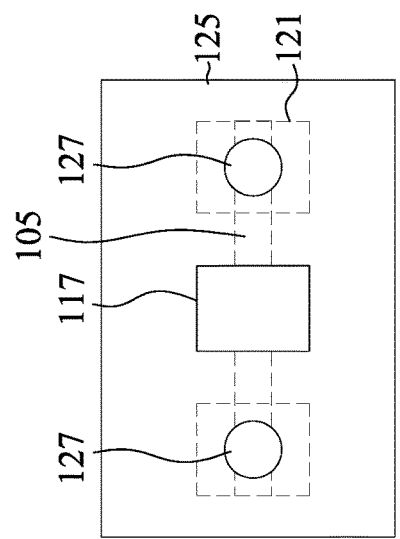
Figure 22C:
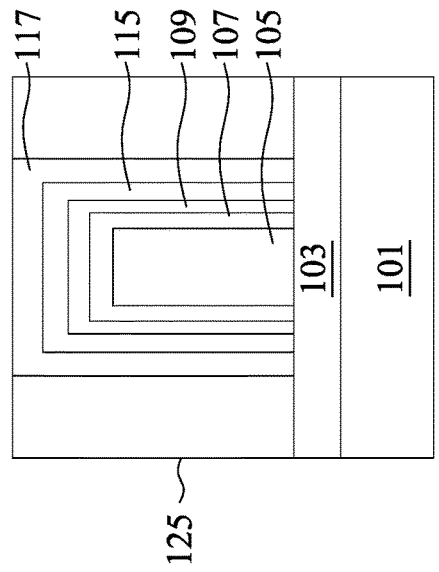
Figure 22D:
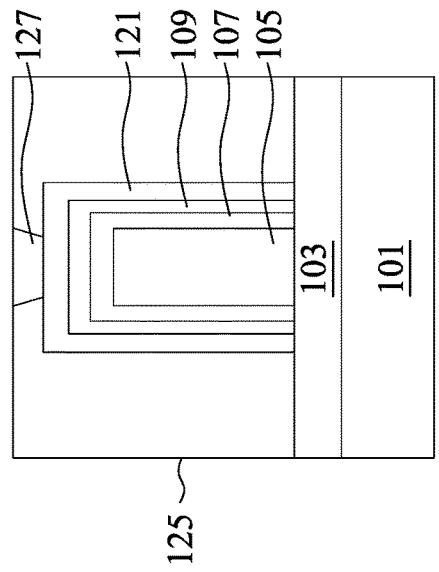

FIGS. 18A-18D and 19A-19D illustrate cross-sectional views of a FinFET device 100C at various stages of manufacturing, in accordance with an embodiment. The FinFET device 100C is similar to the FinFET device 100 in FIGS. 14A-14C and may be formed by similar process steps, but during the etching process 112 of FIG. 5A, the etching process 112 is a selective etching process that removes exposed portions (e.g., portions not protected by the patterned mask layer 111) of the channel layer 107 without substantially attacking the dielectric fin 105. Therefore, after the etching process 112, surfaces (e.g., upper surface and sidewalls) of end portions of the dielectric fin 105 disposed outside lateral extents of the channel layer 107 (e.g., portions not directly under the channel layer 107) are exposed. Subsequently, the gate structure 116 is formed, the SAM layer 119 is formed, the metal layer 121 is formed over the end portions of the dielectric fins 105, and metal source/drain regions 121 are formed, following similar processing as FIGS. 7A-7B, 8A-8C, 9A-9B, 10A-10B and 11. Note that FIG. 18D illustrates the cross-sectional view of the FinFET device 100C along cross-section C-C in FIG. 18A.

Next, in FIGS. 19A-19D, an upper layer of the channel layer 107 is converted into the channel enhancement layer 109 using a doping process, the passivation layer 125 is formed next, and contacts 127 are formed in the passivation layer 125 to electrically couple to the source/drain regions 121, following similar processing as FIGS. 13A-13C and 14A-14C. Note that in the example of FIG. 19A, the metal source/drain regions 121 extends along the sidewalls of the channel enhancement layer 109 and sidewalls of the channel layer 107, but does not extend along the upper surface of the channel enhancement layer 109.

FIGS. 20A-20D illustrate cross-sectional views of a FinFET device 100D, in accordance with another embodiment. The FinFET device 100D is similar to the FinFET device 100C in FIGS. 19A-19D, but the metal source/drain regions 121 extends along the sidewalls of the channel enhancement layer 109 and along the upper surface of the channel enhancement layer 109. The difference between the FinFET devices 100C and 100D may be a result of different thicknesses $L_{SAM}$ of the SAM layer 119 used during manufacturing.

FIGS. 21A-21D and 22A-22D illustrate cross-sectional views of a FinFET device 100E at various stages of manufacturing, in accordance with yet another embodiment. The FinFET device 100E is similar to the FinFET device 100 in FIGS. 14A-14C, but the metal source/drain regions 121 are formed over end portions of the dielectric fin 105 such that the metal source/drain regions 121 do not extend along second sidewalls 105B of the dielectric fin 105. FIGS. 21A-21D correspond to the processing stage in FIGS. 12A and 12B of the FinFET device 100. FIGS. 22A-22D correspond to the processing stage in FIGS. 14A-14C of the FinFET device 100.

Figure 24:
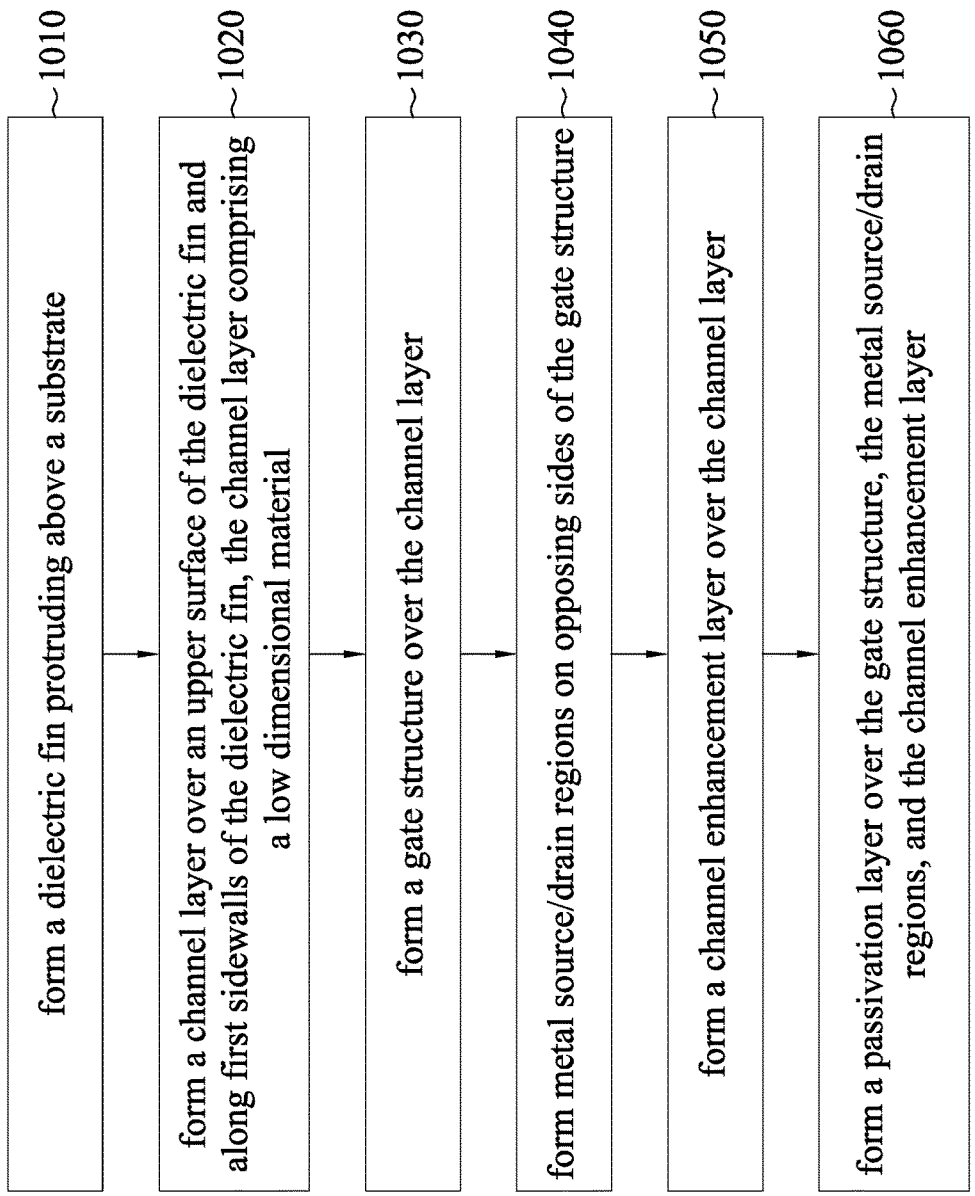
FIG. 24 illustrates a flow chart of a method of forming a semiconductor device, in some embodiments.

FIG. 24 illustrates a flow chart of a method 1000 of forming a semiconductor device, in some embodiments. It should be understood that the embodiment method shown in FIG. 24 is merely an example of many possible embodiment methods. One of ordinary skill in the art would recognize many variations, alternatives, and modifications. For example, various steps as illustrated in FIG. 24 may be added, removed, replaced, rearranged, or repeated.

Referring to FIG. 24, at step 1010, a dielectric fin is formed protruding above a substrate. At step 1020, a channel layer is formed over an upper surface of the dielectric fin and along first sidewalls of the dielectric fin, the channel layer comprising a low-dimensional material. At step 1030, a gate structure is formed over the channel layer. At step 1040, metal source/drain regions are formed on opposing sides of the gate structure. At step 1050, a channel enhancement layer is formed over the channel layer. At step 1060, a passivation layer is formed over the gate structure, the metal source/drain regions, and the channel enhancement layer.

Embodiment may achieve advantages. For example, the various embodiment FinFET device structures using low-dimensional material provide promising candidate FinFET structures for next generation devices. The use of low-dimensional material in the channel layer allows for excellent electrostatic control, and may suppress short channel effect. The band gap size of the semiconducting low-dimensional material (e.g., around 1 eV) may allow for a complete OFF state for the device formed while achieving high current density during ON state. By adjusting the thickness $L_{SAM}$ of the SAM layer 119, the shape of the source/drain regions 121 and the gap size between the source/drain regions 121 and the gate electrode 117 are easily adjusted to meet different design requirements.

In accordance with an embodiment, a method includes: forming a dielectric fin protruding above a substrate; forming a channel layer over an upper surface of the dielectric fin and along first sidewalls of the dielectric fin, the channel layer comprising a low dimensional material; forming a gate structure over the channel layer; forming metal source/drain regions on opposing sides of the gate structure; forming a channel enhancement layer over the channel layer; and forming a passivation layer over the gate structure, the metal source/drain regions, and the channel enhancement layer. In an embodiment, the low dimensional material comprises a two-dimensional semiconducting material, carbon nanotubes, or graphene nanoribbons. In an embodiment, the two-dimensional semiconducting material comprises MoS2, WS2, or WSe2. In an embodiment, forming the metal source/drain regions comprises: selectively forming a self-assembled molecule (SAM) layer over an upper surface and sidewalls of the gate structure; depositing a metal layer over the SAM layer and over the substrate; attaching an adhesive tape over the deposited metal layer; and peeling the adhesive tape off, wherein peeling the adhesive tape removes the SAM layer and an upper portion of the deposited metal layer, wherein a remaining portion of the deposited metal layer after the peeling forms the metal source/drain regions, wherein there is a gap between the gate structure and the metal source/drain regions after the peeling. In an embodiment, the method further includes adjusting a width of the gap between the gate structure and the metal source/drain regions by adjusting a length of molecules in the SAM layer. In an embodiment, the metal source/drain regions extend along second sidewalls of the dielectric fin. In an embodiment, the metal source/drain regions further extend along an upper surface of the channel layer distal from the substrate. In an embodiment, forming the channel enhancement layer comprises performing a plasma process to convert an upper layer of the channel layer into the channel enhancement layer. In an embodiment, forming the channel enhancement layer comprises applying a chemical solution to the channel layer to convert an upper layer of the channel layer into the channel enhancement layer. In an embodiment, forming the channel enhancement layer comprises depositing an oxide of the low dimensional material over the channel layer. In an embodiment, the method further includes: forming openings in the passivation layer to expose the gate structure and the metal source/drain regions; and forming contact plugs in the openings.

In accordance with an embodiment, a method includes: forming a dielectric fin over a substrate; forming a channel layer over the dielectric fin, the channel layer comprising low dimensional material; forming a metal gate structure over the channel layer; selectively forming a self-assembled molecule (SAM) layer over the metal gate structure; depositing a metal material over the SAM layer and over the substrate; attaching an adhesive tape to the metal material; and peeling off the adhesive tape to remove the SAM layer and an upper layer of the metal material, wherein after peeling off the adhesive tape, a remaining portion of the metal material form source/drain regions on opposing sides of the metal gate structure. In an embodiment, the method further includes, after the peeling off, doping the channel layer to convert an upper layer of the channel layer into a channel enhancement layer. In an embodiment, doping the channel layer comprises doping the channel layer by performing a plasma process. In an embodiment, depositing the metal material comprises depositing a P-type metal material or an N-type metal material. In an embodiment, after the peeling off, there is a gap between the metal gate structure and the source/drain regions, wherein the method further comprises adjusting a molecule length of molecules in the SAM layer to adjust a width of the gap.

In accordance with an embodiment, a fin field-effect transistor (FinFET) device includes: a substrate; a dielectric fin protruding above the substrate; a gate structure over the dielectric fin; a channel layer between the dielectric fin and the gate structure, wherein the channel layer comprises a low dimensional material, and extends over an upper surface of the dielectric fin and along sidewalls of the dielectric fin; a channel enhancement layer between the gate structure and the channel layer; and metal source/drain regions on opposing sides of the gate structure. In an embodiment, the low dimensional material comprises a two-dimensional semiconducting material, carbon nanotubes, or graphene nanoribbons, wherein the channel enhancement layer is a doped layer of the channel layer. In an embodiment, the channel layer covers a first portion of the upper surface of the dielectric fin and exposes a second portion of the upper surface of the dielectric fin, wherein a lower surface of the metal source/drain regions facing the substrate contacts the second portion of the upper surface of the dielectric fin. In an embodiment, the channel enhancement layer comprises an oxide of the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dielectric fin protruding above a substrate;
    forming a channel layer over an upper surface of the dielectric fin and along first sidewalls of the dielectric fin, the channel layer comprising a low dimensional material;
    forming a gate structure over the channel layer;
    forming metal source/drain regions on opposing sides of the gate structure;
    forming a channel enhancement layer over the channel layer; and
    forming a passivation layer over the gate structure, the metal source/drain regions, and the channel enhancement layer.

2. The method of claim 1, wherein the low dimensional material comprises a two-dimensional semiconducting material, carbon nanotubes, or graphene nanoribbons.

3. The method of claim 2, wherein the two-dimensional semiconducting material comprises $MoS_2$, $WS_2$, or $WSe_2$.

4. The method of claim 1, wherein forming the metal source/drain regions comprises:
    selectively forming a self-assembled molecule (SAM) layer over an upper surface and sidewalls of the gate structure;

depositing a metal layer over the SAM layer and over the substrate;

attaching an adhesive tape over the deposited metal layer; and peeling the adhesive tape off, wherein peeling the adhesive tape removes the SAM layer and an upper portion of the deposited metal layer, wherein a remaining portion of the deposited metal layer after the peeling forms the metal source/drain regions, wherein there is a gap between the gate structure and the metal source/drain regions after the peeling.

5. The method of claim 4, further comprising adjusting a width of the gap between the gate structure and the metal source/drain regions by adjusting a length of molecules in the SAM layer.

6. The method of claim 5, wherein the metal source/drain regions extend along second sidewalls of the dielectric fin.

7. The method of claim 6, wherein the metal source/drain regions further extend along an upper surface of the channel layer distal from the substrate.

8. The method of claim 1, wherein forming the channel enhancement layer comprises performing a plasma process to convert an upper layer of the channel layer into the channel enhancement layer.

9. The method of claim 1, wherein forming the channel enhancement layer comprises applying a chemical solution to the channel layer to convert an upper layer of the channel layer into the channel enhancement layer.

10. The method of claim 1, wherein forming the channel enhancement layer comprises depositing an oxide of the low dimensional material over the channel layer.

11. The method of claim 1, further comprising:
forming openings in the passivation layer to expose the gate structure and the metal source/drain regions; and
forming contact plugs in the openings.

12. A method comprising:
forming a dielectric fin over a substrate;
forming a channel layer over the dielectric fin, the channel layer comprising low dimensional material;
forming a metal gate structure over the channel layer;
selectively forming a self-assembled molecule (SAM) layer over the metal gate structure;
depositing a metal material over the SAM layer and over the substrate;
attaching an adhesive tape to the metal material; and
peeling off the adhesive tape to remove the SAM layer and an upper layer of the metal material, wherein after peeling off the adhesive tape, a remaining portion of the metal material form source/drain regions on opposing sides of the metal gate structure.

13. The method of claim 12, further comprising, after the peeling off, doping the channel layer to convert an upper layer of the channel layer into a channel enhancement layer.

14. The method of claim 13, wherein doping the channel layer comprises doping the channel layer by performing a plasma process.

15. The method of claim 12, wherein depositing the metal material comprises depositing a P-type metal material or an N-type metal material.

16. The method of claim 12, wherein after the peeling off, there is a gap between the metal gate structure and the source/drain regions, wherein the method further comprises adjusting a molecule length of molecules in the SAM layer to adjust a width of the gap.

17. A method comprising:
forming a dielectric fin protruding above a substrate;
forming a channel layer that extends over an upper surface of the dielectric fin and along sidewalls of the dielectric fin, wherein the channel layer comprises a low dimensional material;
forming a gate structure over the channel layer;
forming a channel enhancement layer over the channel layer, wherein the channel enhancement layer is a doped layer of the channel layer; and
forming metal source/drain regions on opposing sides of the gate structure.

18. The method of claim 17, wherein the low dimensional material comprises a two-dimensional semiconducting material, carbon nanotubes, or graphene nanoribbons.

19. The method of claim 18, wherein the channel layer is formed to cover a first portion of the upper surface of the dielectric fin and expose a second portion of the upper surface of the dielectric fin, wherein a lower surface of the metal source/drain regions facing the substrate is formed to contact the second portion of the upper surface of the dielectric fin.

20. The method of claim 18, wherein the channel enhancement layer comprises an oxide of the channel layer.

\* \* \* \* \*